(12) United States Patent
Whitaker et al.

(10) Patent No.: US 10,157,668 B2
(45) Date of Patent: Dec. 18, 2018

(54) MEMRISTANCE FEEDBACK TUNING

(71) Applicant: HEWLETT PACKARD ENTERPRISE DEVELOPMENT LP, Houston, TX (US)

(72) Inventors: Luke Whitaker, Fort Collins, CO (US); Emmanuelle J. Merced Grafals, Palo Alto, CA (US); Martin Foltin, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/566,867

(22) PCT Filed: May 29, 2015

(86) PCT No.: PCT/US2015/033297
§ 371 (c)(1),
(2) Date: Oct. 16, 2017

(87) PCT Pub. No.: WO2016/195637
PCT Pub. Date: Dec. 8, 2016

(65) Prior Publication Data
US 2018/0108410 A1    Apr. 19, 2018

(51) Int. Cl.
*G11C 11/00* (2006.01)
*G11C 13/00* (2006.01)
*G11C 11/56* (2006.01)

(52) U.S. Cl.
CPC ...... *G11C 13/0064* (2013.01); *G11C 13/0069* (2013.01); *G11C 11/56* (2013.01);
(Continued)

(58) Field of Classification Search
CPC . G11C 13/0064; G11C 13/0069; G11C 11/56; G11C 2013/005; G11C 2013/0073;
(Continued)

(56) References Cited

U.S. PATENT DOCUMENTS

| 8,416,604 B2 | 4/2013 | Kim et al. |
| 2010/0232206 A1 | 9/2010 | Li et al. |

(Continued)

FOREIGN PATENT DOCUMENTS

WO    WO-13015803 A1    1/2013

OTHER PUBLICATIONS

Merkel, C. E. et al., "Reconfigurable N-Level Memristor Memory Design," (Research Paper), Jul. 31-Aug. 5, 2011, Proceedings of International Joint Conference on Neural Networks, pp. 3042-3048.

*Primary Examiner* — Toan Le
(74) *Attorney, Agent, or Firm* — Hewlett Packard Enterprise Patent Department

(57) ABSTRACT

An example device in accordance with an aspect of the present disclosure includes at least one current comparator, a plurality of threshold currents, and a controller. The current comparator is to compare a memristor current to a plurality of threshold currents. The controller is to set a desired memristance state of a memristor according to a memristance feedback tuning loop based on a plurality of threshold levels. The controller is to apply positive and negative voltages to the memristor during the feedback tuning loop to achieve the desired memristance state of the memristor.

15 Claims, 6 Drawing Sheets

(52) U.S. Cl.
CPC .. *G11C 2013/005* (2013.01); *G11C 2013/009* (2013.01); *G11C 2013/0073* (2013.01); *G11C 2013/0076* (2013.01); *G11C 2013/0092* (2013.01)

(58) Field of Classification Search
CPC ...... G11C 2013/0076; G11C 2013/009; G11C 2013/0092
See application file for complete search history.

(56) References Cited

U.S. PATENT DOCUMENTS

| | | |
|---|---|---|
| 2010/0235714 A1 | 9/2010 | Toda |
| 2011/0279135 A1 | 11/2011 | Borghetti et al. |
| 2012/0127780 A1 | 5/2012 | Strachan et al. |
| 2012/0195099 A1* | 8/2012 | Miao .................. G11C 11/5685 365/148 |
| 2013/0058153 A1 | 3/2013 | Chang et al. |
| 2013/0223134 A1* | 8/2013 | Yi ...................... G11C 13/0007 365/148 |
| 2013/0301335 A1 | 11/2013 | Ong |
| 2013/0343114 A1* | 12/2013 | Carter ................ G11C 13/0007 365/148 |
| 2014/0016396 A1 | 1/2014 | Mazumder et al. |
| 2017/0271003 A1* | 9/2017 | Jeon .................. G11C 13/0033 |
| 2017/0271004 A1* | 9/2017 | Jeon .................. G11C 13/0007 |
| 2017/0291414 A1* | 10/2017 | Ge ...................... B41J 2/04541 |

\* cited by examiner

MEMRISTANCE FEEDBACK TUNING

BACKGROUND

Memristors can be organized in large arrays to build dense non-volatile memory (NVM). A write operation places the memristor into a known state, establishing a read margin. Two memristance states can be used to represent logic 0 and logic 1, called the low resistive state (LRS) and high resistive state (HRS), respectively.

BRIEF DESCRIPTION OF THE DRAWINGS/FIGURES

DETAILED DESCRIPTION

Memristors can be associated with the issue of having variations in distributions of written states, resulting in low read margins and corresponding complications in attempting to read the memristors. Earlier approaches may use an open-loop write, by applying the same write pulse to memristors without checking to see whether the memristance is near its desired target value. Because the voltage at which the memristance switches can have a large variation, e.g., between different memristors and also between cycles (cycle-to-cycle) for a given memristor, the final memristance value that gets set can varying widely. This results in wide distributions and low read margins, enough that it becomes difficult to reliably distinguish between the LRS and the HRS of memristors in an array.

To address such issues, examples described herein allow for fine tuning of the memristor states, which reduces the distributions and widens the read margins. Examples may compare, using at least one current comparator, a memristor current of a memristor to a plurality of threshold currents, and apply, by a controller, positive and negative voltages to the memristor during a memristance feedback tuning loop based on a plurality of threshold levels corresponding to the plurality of threshold currents, to achieve a desired memristance state of the memristor. In this manner, examples described herein enable closed loop memristor writes according to a memristance feedback tuning loop using multiple threshold levels. Feedback is used to more accurately set the desired memristance state, thereby reducing the state distributions and increasing read margins. The described approaches can be extended to operate on more than two memristance states (i.e., enabling multi-bit memristors having more than logic 1 and logic 0 states). Thus, advantages include tighter state distributions, higher read margins, and the ability to program multiple states. Furthermore, the highly accurate and precise writes enabled by the examples described herein provide for faster reads of those written memristors. For example, fixed-threshold reads may be used, based on a relatively tighter read distribution, enabling simpler and faster reads.

Figure 1:
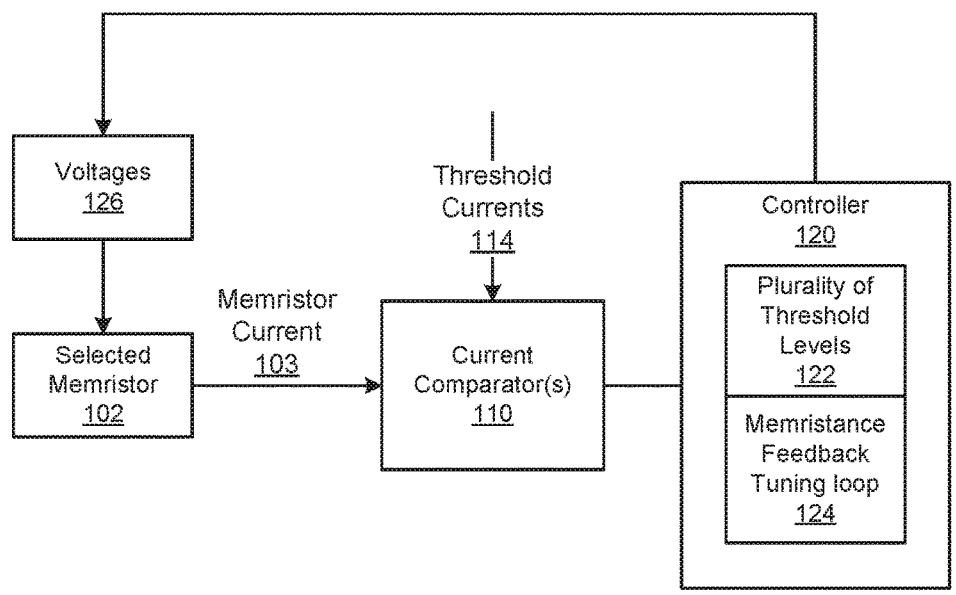
FIG. 1 is a block diagram of a system including a memristance feedback tuning loop according to an example.

FIG. 1 is a block diagram of a system 100 including a memristance feedback tuning loop 124 according to an example. The system 100 also includes a controller 120, voltages 126, memristor 102, current comparator(s) 110, and current threshold(s) 114. The controller 120 is to control voltages 126, and is associated with a plurality of threshold levels 122 and the memristance feedback tuning loop 124. The memristor 102 is to provide memristor current 103 in response to the voltages 126. The memristor current 103 is compared with the threshold current(s) 114 by the current comparator(s) 110. Results of the current comparator(s) 110 are used by the controller 120 to adjust voltages 126 used to write the memristor 102, e.g., to successively/iteratively approach a target memristance value when writing data to a given memristor 102. Although a single memristor 102 is shown, examples may include a plurality of memristors 102, such as a cross-point array of many memristors 102 in one, two or three dimensions.

The system 100 can write the memristor 102 based on a digital feedback tuning loop mechanism, whereby multiple write voltages 126 followed by a subsequent read/verify voltage 126 are applied to the memristor 102. The read/verify operation enables determination of the memresistance state of the memristor 102, which is provided to the current comparator(s) 110 (e.g., in the form of a current and/or read voltage). The current comparator(s) 110 compare the memristor current 103 (or equivalent) with respective threshold current(s) 114, and generates feedback signal outputs to the controller 120. The current comparator(s) 110 may provide outputs based on a plurality of binary bits, e.g., based on a parallel or serial comparison (e.g., see FIGS. 2 and 3 for example serial and parallel approaches). Output of the current comparators 110 identifies the range of the memresistance of the memristor 102, e.g., based on a binary pattern of ones and zeros. Subsequent write voltage 126 is adjusted according to a resistance range, until the target memristor resistance is reached. The controller 120 is thereby capable of reaching a desired memristor resistance state, reducing the memristor state distributions and increasing read margins.

The controller 120 can use various approaches for controlling the voltage 126 across the selected memristor 102. For example, the controller 120 may be based partially on a successive approximation register (SAR) approach, using multiple different thresholds to achieve an initial rough memristance value (e.g., applying Vcoarse values prior to switching to a finer control loop approach and applying Vfine values to achieve a final memristance value). The controller 120 may be based on other implementations, such as those including a voltage digital-to-analog controller (voltage DAC), a ramp generator, or other implementation that can satisfactorily react to the outputs of the current comparator(s) 110 and control the voltage(s) 126 applied to the memristor 102. Other example implementations of the controller 120 include a field-programmable gate array (FPGA), application-specific integrated circuit (ASIC), microcontroller, and the like. Such controllers 120 can receive instructions, e.g., to implement the memristance feedback tuning loop 124, based on Verilog hardware development language, Labview programming, and other software approaches. The example controller 120 may control the voltages 126 applied to the memristor 102 to deliver, e.g., voltage pulses having a fixed time duration, to control the memristance of the selected memristor 102. However, memristance of a given memristor 102 can be sensitive to voltage pulse shape, magnitude, and duration. Such sensitivity can be based on a model of the particular memristor 102 used. Accordingly, controller 120 may deliver combinations of pulse shapes, pulse magnitudes, and pulse durations (such as ramped pulse or variable pulse durations) as appropriate for a given type of memristor 102 to respond favorably to the memristance feedback tuning loop 124.

Figure 2:
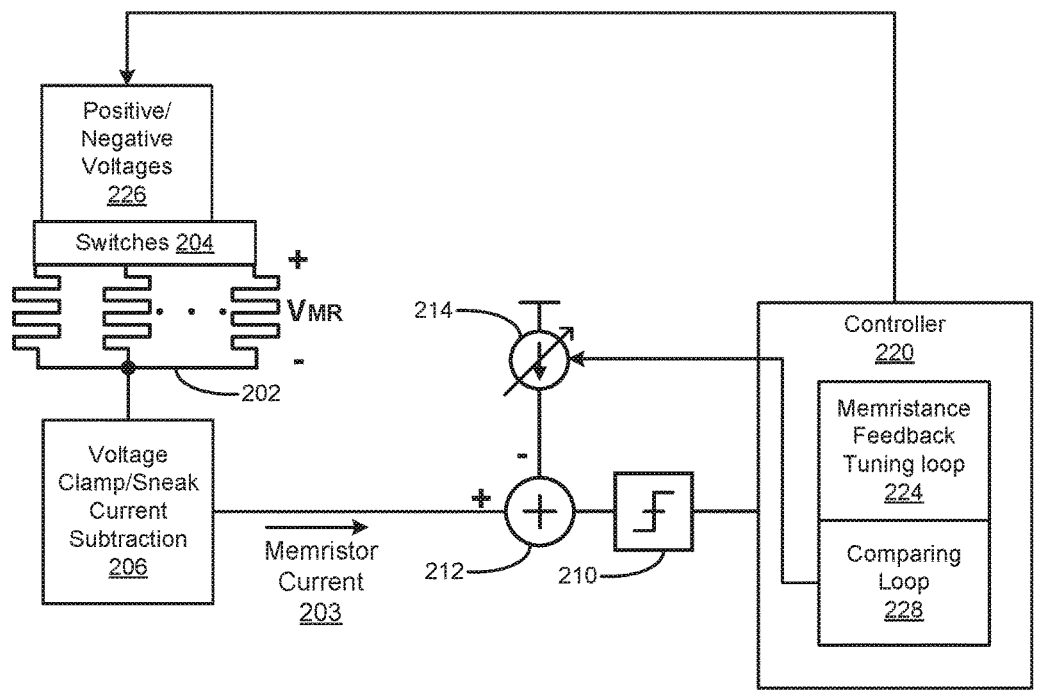
FIG. 2 is a block diagram of a system including a memristance feedback tuning loop according to an example.

FIG. 2 is a block diagram of a system 200 including a memristance feedback tuning loop 224 according to an example. The system 200 also includes a controller 220, voltages 226, switches 204, memristors 202, voltage clamp and/or sneak current subtraction 206 (e.g., used to isolate the memristor current 203), current summer 212, variable threshold current generator 214, and current comparator 210. The controller 220 is to control voltages 226 and/or switches 204, and includes the memristance feedback tuning loop 224 and comparing loop 228. The switches 204 are to select one of the memristors 202, and the selected memristor 202 is to provide memristor current 203, which is compared with the threshold current(s) provided by the variable threshold current generator 214. The comparison is achieved by iteratively (according to the comparing loop 228) summing the memristor current 203 and the variable threshold current 214 over a plurality of increments of the variable threshold current 214, and summing the current via the current comparator 210 during the comparing loop 228. Accordingly, the controller 220 may accumulate the comparison results for the comparing loop 228, identifying which (if any) of the variable threshold currents are greater than or not greater than the memristor current 203. Such results are used by the controller 220 to adjust voltages 226 used to write the memristor 202, e.g., to successively approach a target memristance value when writing data to a given memristor 202.

The system 200 achieves a reduction in circuit area by relying on a serial approach under the comparing loop 228, thereby using one variable threshold current generator 214, one current summer 212, and one current comparator 210. Although not specifically shown, the system 200 may use a current mirror to perform the comparison on a mirrored memristor current 203. The variable threshold current generator 214 may be provided as a current DAC. Thus, overall circuit layout may be relatively compact and low-power, while allowing comparisons to be performed in series over time according to the memristance feedback tuning loop 224 having a plurality of comparing loops 228 nested within it. Tradeoffs between speed, area, power, and other factors may be made (e.g., between the examples of FIG. 2 and FIG. 3) generally according to preferred features of a given circuit implementation.

By way of further explanation, an iteration of the memristance feedback tuning loop 224 can be performed to check whether the memristor 202 is set to a desired value. That iteration can include a nested comparing loop 228 which iterates a plurality of times, to serially compare the memristor current 203 against a series of variable threshold currents 214. For example, a first iteration of the memristance feedback tuning loop 224 can involve setting the memristor 202 to an initial memristance $MR_0$, resulting in an initial memristor current 203. During this first feedback tuning loop iteration, the controller 220 can perform multiple iterations of the comparing loop 228, to test if the memristor current 203 falls within a range of variable threshold currents 214, such as thresholds 1-6. Accordingly, the comparing loop 228 starts with a low threshold current, performs the current comparison, and iteratively increases the threshold current a plurality of times, successively comparing the variable currents with the memristor current 203 for that single iteration of the main memristance feedback tuning loop 224. Thus, the comparing loop 228 may accumulate a plurality of comparison results for a given iteration of the memristance feedback tuning loop 224, which may be represented as logic bits. For example, the comparing loop 228 may perform six comparisons, and all six may result in logic 000000 because the memristor current 203 was below the range of all six variable threshold currents 214 involved in the comparing loop 228. Thus, the first iteration of the memristance feedback tuning loop 224 completes. The controller sees the logic 000000 result, and adjusts/writes to the memristor 202 using an appropriate positive or negative voltage 226 to cause the memristor current 203 to increase, in an attempt to fall within the range of the variable threshold currents 214 used in the comparing loop 228. The comparing loop 228 is again performed, and perhaps the result is logic 000001, whereby the six iterations of varying the threshold current 214 result in five comparisons missing, but the final iteration/comparison achieving a logic 1. This indicates to the controller 220 that the memristance is within the memristance tuning window formed by the plurality of varying threshold currents 214, and is approaching the target memristance window/value. On the third iteration of the memristance feedback tuning loop 224, the controller 220 may further adjust/write the memristor 202, and the nested comparing loop 228 is performed, which results in logic 000111, indicating that the target memristance value has been reached. Thus, the system 200 has achieved the target value for the memristor 202 based on three iterations of the memristance feedback tuning loop 224, where each iteration involved six iterations of the comparing loop 228 (or 18 total iterations of the comparing loop 228). Thus, the system 200 can achieve high accuracy using a relatively small circuit area footprint, at the cost of performing a number of iterations and any associated latency effects.

Figure 3:
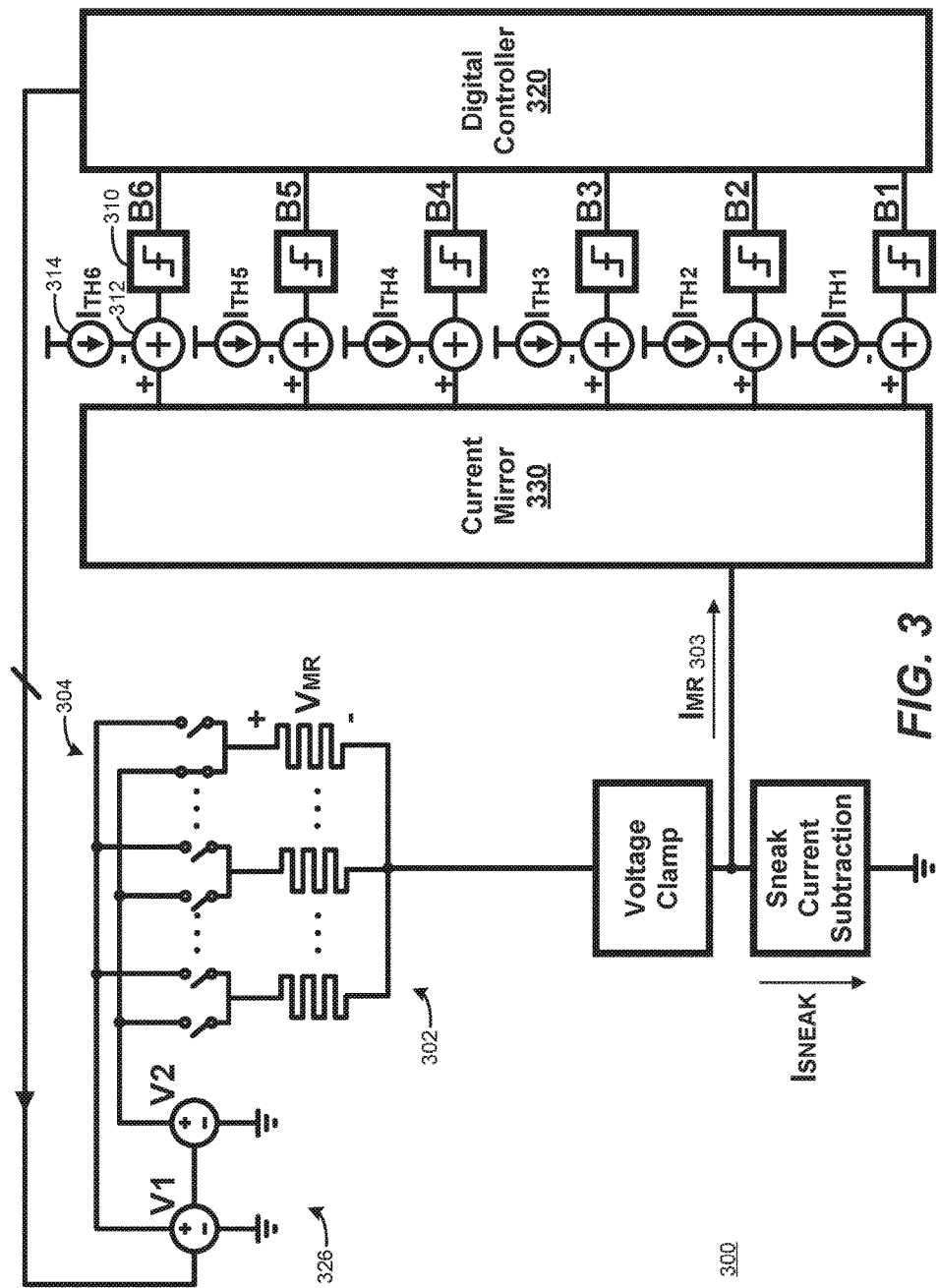
FIG. 3 is a block diagram of a system including a plurality of comparators according to an example.

FIG. 3 is a block diagram of a system 300 including a plurality of comparators 310 according to an example. The system 300 also includes a controller 320, voltages 326, switches 304, memristors 302, current mirror 330, a plurality of current summers 312, and a plurality of threshold currents 314. The controller 320 is to control voltages 326 according to a memristance feedback tuning loop. The switches 304 are to select one of the memristors 302, and the selected memristor 302 is to provide memristor current 303 ($I_{MR}$). The memristor current 303 is duplicated by current mirror 330, to enabling parallel comparisons of the memristor current 303 by the plurality of comparators 310. The system 300 can thereby perform a plurality of sums using duplicate memristor currents 303, from the current mirror 330. The plurality of sums include a corresponding plurality of threshold currents 314 varying between $I_{TH1}$-$I_{TH6}$. The plurality of comparisons enable the controller 320 to obtain six resulting comparison bits (B1-B6) in parallel. Thus, the comparison bits reveal whether the memristor current 303 is above (e.g., 111111), below (e.g., 000000), or within the range of the plurality of threshold currents 314 (where the comparison bits would include at least one logic 0 and at least one logic 1). Thus, the controller 320 can immediately obtain the comparison results in parallel for a given iteration of the memristance feedback tuning loop, without needing to perform nested control loops to vary the threshold currents 314. Such comparison results are used by the controller 320 to adjust voltages 326 used to write the memristor 302, e.g., to successively/iteratively approach a target memristance value when writing data to a given memristor 302. The current mirror 330, current thresholds 314, current summers 312, current comparators 310, and digital controller 320 thereby achieve high speed and accuracy as well as low latency, by having a relatively larger circuit area compared to the example of FIG. 2 and by performing multiple comparisons in parallel. The example system 300 is shown for six logic bits B1-B6, although the examples can be extended to N bits as desired for higher resolution and/or range of the memristance tuning window.

By way of further explanation, current mirror 330 is to create N duplicates (N=six in the illustrated example system 300) of the memristor current $I_{MR}$ 303, and send the duplicated currents to the current summers 312. The current summers 312 sum the mirrored memristor currents 303 and the negative of their respective threshold currents 314 ($-I_{THX}$, where X=1 through 6). Each threshold current 314 corresponds to a particular memristance value, such that the plurality of current thresholds 314 form a range of values. The difference currents produced as a result of the current summers 312 are sent to the current comparators 310, which quantize the output values by outputting a logic 1 if their result is positive, or a logic 0 if their result is negative. This aspect of the illustrated circuit example is similar to a current-mode flash analog-to-digital converter (ADC). This topology resolves all values in parallel in one cycle/iteration of the main memristance feedback tuning loop, whereby the controller can increment or decrement the memristance value and run another loop as needed, without needing to perform nested comparing loops.

The plurality of current thresholds 314 may be generated by a current DAC, and may be set for a given target memristance value that is to be written. Thus, a first set of current thresholds 314 may be set for one desired memristance level (e.g., logic 1 for the HRS of the memristor), and a second set of current thresholds 314 may be set for another desired memristance level (e.g., logic 0 for LRS of the memristor). Additional sets of current thresholds 314 may be used as desired, e.g., for a multi-bit memristor 302 having more than two logic states. The plurality of current thresholds 314 may be set according to what desired level is to be written to the memristor 302. The current DAC can be controlled by the controller 320 to provide a given set of current thresholds 314, according to what state of the memristor 302 the controller 320 is to set for a given memristance feedback tuning loop.

Thus, examples described herein enable a hybrid approach to achieving a target value for the memristors 302, using techniques similar to a successive-approximation-register (SAR) and a flash comparison. The successive approximation approach can be used to fine-tune each iteration of the memristance feedback tuning loop, reducing the memristance value when it falls above the window of threshold currents, and increasing the memristance value when it falls below the window. This enables the value of the memristor to eventually fall within the window covered by the range of different threshold currents 314. Once within that window, the flash comparison performed by parallel current comparisons immediately identifies the given memristance value, so long as it falls at or within that current window spanning $I_{TH1}$-$I_{THN}$. Once within the window, the system 300 can perform fine-tuning to move the memristance value to coincide with the desired value (e.g., corresponding to a memristance current 303 resulting in logic bits of 000111). Thus, system 300 achieves fine-tuning with multiple parallel steps and fewer iterations/cycles, thereby reducing overall latency in writing at the expense of relatively larger circuit area.

Figure 4:
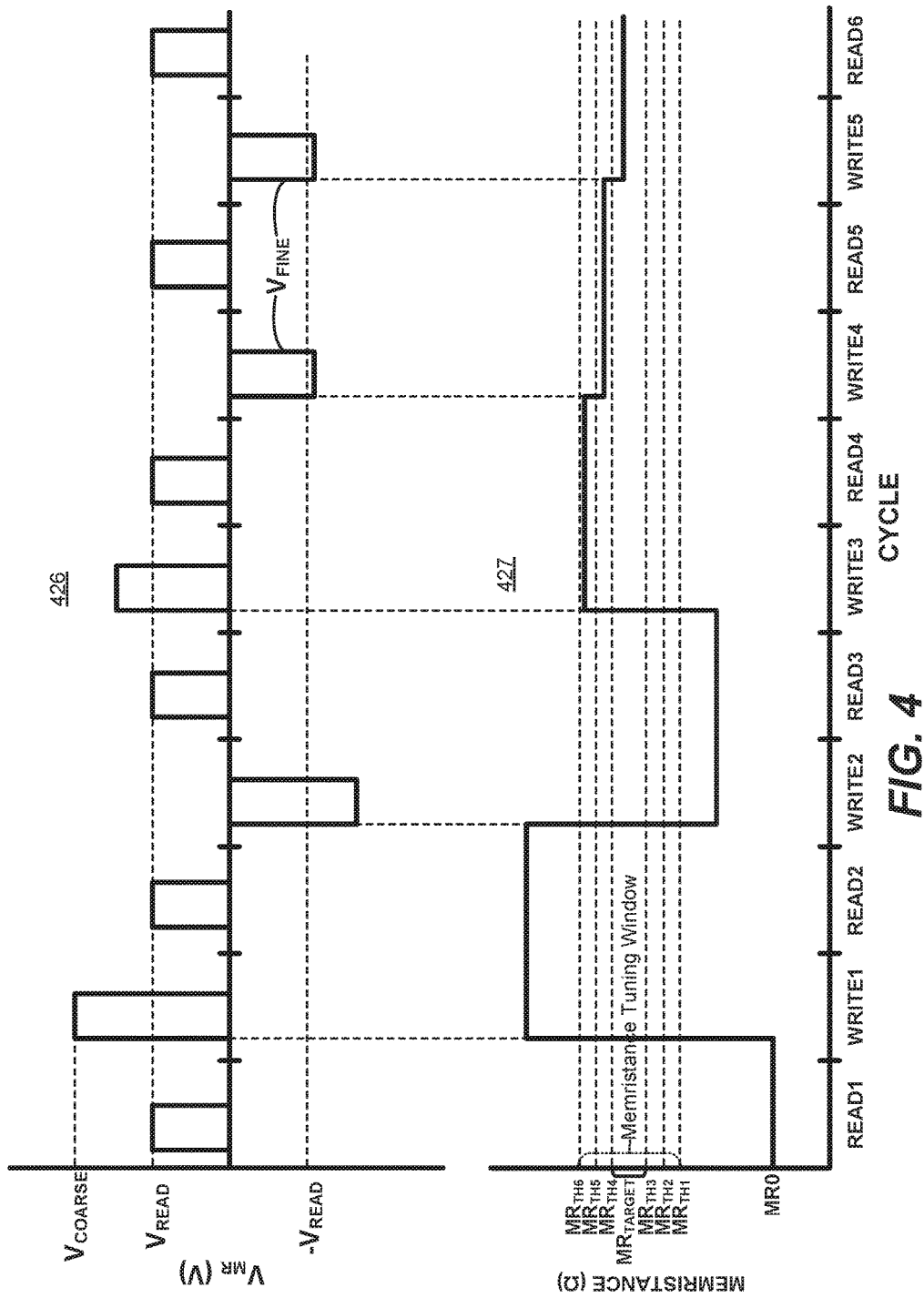
FIG. 4 is a chart of memristor voltage and memristor memristance for a memristance feedback tuning loop according to an example.

FIG. 4 is a chart of memristor voltage 426 (e.g., the voltage $V_{MR}$ across a selected memristor to be tuned), and memristor memristance 427, for various cycles of a memristance feedback tuning loop according to an example. The chart of FIG. 4 is not shown to scale for convenience of illustrating each cycle having a roughly equal duration, because the actual durations of the various read and write cycles will depend on attributes of the waveforms including their particular shapes/pulse widths, in addition to their illustrated magnitudes, and the particular characteristics of the memristors (which can be modeled/predicted). For example, the reads can be performed relatively quickly, and the writes might be performed in a relatively longer time period (e.g., taking four times as long as the reads). In alternate examples, the writes could be performed in a shorter time period than the reads, according to the particular characteristics of the voltage pulses applied for reading and/or writing (e.g., applying a series of narrow pules, instead of one large pulse, for a read or write). In an example, a read may be performed in the time period of, on the order of, 200 nanoseconds, the writes may vary depending on types of voltage pulses used, and the entire illustrated cycle in FIG. 4 may be performed in the time period of, on the order of, one to two microseconds. Furthermore, for the sake of simplicity, memristor selectors are not discussed in this example.

The chart of FIG. 4 may represent the operation of the system shown in FIG. 3. When the voltage $V_{MR}$ 426 that is applied to the selected memristor is less than |VREAD|, the value of the memristance 427 can be read out without changing (disturbing) the memristance (i.e., because $V_{MR}$ is below the threshold needed to start writing the memristor). When $V_{MR}$ 427 is greater than |VREAD|, the memristance can change, e.g., by application of Vcoarse and Vfine (e.g., values whose effect is just greater than VREAD).

An iteration of the memristance feedback tuning loop illustrated in FIG. 4 can involve iterative application of Vcoarse, to move the memristance 427 to fall within the memristance tuning window and/or by application of a Vfine value (e.g., values of Vcoarse that are closer in effect/value to Vread) to move the memristance 427 to fall within the memristance target window. Specific values that a controller can choose for Vcoarse and/or Vfine can depend on particular characteristics of a particular memristor, and can be adjusted by the controller to vary during the tuning loop according to various patterns/functions. In an example, the controller can include information on a mathematical model of behavior for various types of memristors. The initial choice of Vcoarse applied in FIG. 4 is shown as a relatively large value, based on the initial Vread showing that the initial value MR0 for memristance 427 falls outside the memristance tuning window. If, instead, the initial Vread measurement showed that MR0 was within the memristance tuning window, then a much smaller initial voltage for Vcoarse would have been applied (e.g., using Vfine to move MR0 to the target window). Because MR0 is initially lower than (i.e., outside) the memristance tuning window, the logic bits B1-B6 of FIG. 3 would indicate logic 000000, so a relatively large initial voltage Vcoarse is used. Application of the Vcoarse proceeds iteratively in the memristance feedback tuning loop, such that it may take a variable number of cycles to complete the memristance feedback tuning loop and achieve the final write (depending on how close to the target window and how accurate the Vcoarse turns out to be) for the memristor. The application of multiple Vcoarse values can follow a SAR approach, which can depend upon how tightly the memristance 427 is predicted with respect to the voltage pulses 426 that are applied across the memristor.

As shown, the applications of Vcoarse involve decreasing positive and negative values across the write cycles. A SAR approach can involve decreasing the absolute magnitude of Vcoarse by approximately half, walking through the most significant bit (MSB) to the least significant bit (LSB) in the threshold current DAC, where each bit represents half of the total value, adjusting to converge on the desired voltage 426. In alternate examples, the applied voltages 426 may be varied according to a non-linear approach. For example, a given memristor model may involve a non-linear memristance behavior, such that a map of its memristance with respect to a voltage pulse is a non-linear function. Thus, a controller can take into account the model of the memristor behavior, along with a previously obtained value of memristance 427 and a desired value of memristance 427 to be obtained, and thereby adjust Vcoarse and/or Vfine appropriately between successive iterations/cycles (e.g., Vcoarse may decrease by less than half in successive iterations). Example controllers may perform a type of curve fitting to identify previous and future/desired values for memristance 427, and can use a look up table (not shown) to identify what values for Vcoarse are to be applied to obtain a given change (delta) in memristance 427 based on the previous value of memristance 427. Thus, example controllers described herein may adjust memristance voltage 426 and/or memristance 427 according to linear, quadratic, exponential, natural log, or other patterns, including a piecewise linear curve fit. Such tuning approaches can incorporate models/knowledge of the memristor into the iterative pattern of change performed by the memristance feedback tuning loop.

By way of further explanation, the memristance feedback tuning loop illustrated in FIG. 4 can thereby program the memristance 427 within the target memristance range/window, shown as $MR_{TARGET}$. When the memristance 427 is within the target range, the memristor current will fall in the middle of the range of threshold currents. This is indicated in FIG. 3 by bits B4, B5 and B6 showing logic 0 and bits B1, B2 and B3 showing logic 1. The memristance range of being less than $MR_{TH6}$ and greater than $MR_{TH1}$ is referred to as the memristance tuning window.

During operation of the memristance feedback tuning loop performed by the circuit illustrated in FIG. 3 (e.g., a parallel comparison where N=6), the first operation is to read the initial memristance value, MR0, by applying a positive read voltage 426 and reading out the six comparator values according to cycle READ1. The six comparator outputs indicate logic 0 because the initial memristance MR0 is below all threshold values $MR_{TH1}$-$MR_{TH6}$. Next, the digital controller will apply a voltage, VCOARSE, based on the previously read value MR0 and knowledge of the memristor behavior/model, by performing the cycle WRITE1. A read will follow, READ2, using a voltage 426 of $V_{READ}$, which reads out the six comparator values to be logic 1. This logic 000000 value indicates that the memristance 427 at READ2 has completely overshot the desired memristance tuning window. Next, the polarity of the voltage pulse 426 to be applied is switched from positive to negative, such that a negative voltage pulse Vcoarse (slightly smaller than the last positive voltage pulse Vcoarse) will be used in order to reduce the memristance 427, during WRITE2. Next, a read is again performed, READ3, and the comparators all read out logic value 0, which indicates the memristance overshot the memristance tuning window again, but in the reverse (negative) direction, causing memristance 427 to lie below the memristance tuning window. Next, the polarity of the voltage pulse to be applied after READ3 is again reversed back to a positive voltage pulse, and the selected voltage pulse to be applied in WRITE3 has a magnitude smaller than the initial and previous (WRITE2) voltage pulse Vcoarse. The voltage pulse is then driven across the selected memristor in WRITE3. A read follows, READ4, in which the comparator B6 output is logic 0, while remaining comparator outputs are logic 1, indicating that the memristance 427 at READ4 is now within the memristance tuning window (i.e., the logic output includes at least one logic 0 and at least one logic 1).

Because the memristance 427 at READ4 is still higher than the target range $MR_{TARGET}$, but within the memristance tuning window, the controller may use a different approach to fine tune the memristance. For example, the initial Vcoarse applied when outside the memristance tuning window may be adjusted according to a coarse value change (e.g., decreasing by half). However, when within the memristance tuning window, the controller can identify precisely how far from the memristance target the memristance 427 lies. In the present example, the controller knows at READ4 that the current memristance 427 lies precisely two bits away (e.g., two increments of threshold currents) from the memristance target. Accordingly, the controller may use a finer adjustment increment Vfine when adjusting voltages 426 applied to adjust the memristance 427, when within the memristance tuning window. Thus, a relatively smaller negative voltage pulse is applied in the cycle WRITE4, to fine-tune the memristance 427 closer to the target window. A read is then performed, READ5, to again check where the memristance 427 lies in the memristance tuning window. At READ5, both B6 and B5 are logic 0, and B4-B1 are logic 1, indicating that the memristance has moved closer to the target range. Thus, although the controller has the knowledge to have used a larger/more aggressive value to move the memristance 427 directly to the target in a single cycle, the controller's chosen approach shown in FIG. 4 is more conservative and uses two cycles, to avoid overshooting the target window. At READ5, the memristance 427 is still above the memristance target window, so a small negative pulse is then applied at WRITE5, which moves the memristance 427 again, into the desired target range between thresholds/bits 4 and 3. A final read is performed, READ6, which reads B6, B5 and B4 as logic 0, and B1, B2 and B3 as logic 1, confirming the desired final tuned condition within the target window.

The target window $MR_{TARGET}$ can correspond to a given desired memristance value/state of the memristor, such as a memristor logic 1 (for a binary memristor, e.g., where $MR_0$ corresponds to a logic 0 and may have its own target window). In alternate examples, such as a multi-bit memristor, a plurality of states of the memristor can each be assigned to a corresponding tuning window and target window, having their own set of thresholds related to the tuning/target state ranges/windows.

Accordingly, the memristance feedback tuning loop can behave as a hybrid, wherein it can perform similar to a SAR approach when the memristance 427 lies outside the memristance tuning window, and perform as a flash ADC approach when within the memristance tuning window, by resolving the plurality of bits in one cycle. Alternatively, per the circuit of FIG. 2, the plurality of bits may be resolved when within the memristance tuning window according to a nested comparing loop. Thus, when within the memristance tuning window, the controller can identify what the memristance 427 value is, within the resolution of the difference between the thresholds/bits, to a small percent error. The error value is set by the quantization step between two adjacent thresholds/bits. Thus, such knowledge enables the controller to use a finer granularity in tuning the memristance value 427 toward the memristance target. The controller can include a model or other knowledge of what kind/type/shape of voltage pulse 426 to apply to the memristor, to get an expected change in memristance 427. In view of variations between memristors, the controller can take a more conservative approach to avoid overshooting or other issues.

The relative size of the memristance tuning window, with respect to the adjusting increment between thresholds/bits, can be adjusted by the controller. For example, a smaller increment can fit additional states within a given memristance range. Additionally, a desired sensitivity capability of tuning the resistance can be a function of the number of states chosen, e.g., the illustrated 6 states in the memristance tuning windows, or higher resolution sensitivity based on 16 states, 32, 64, and so on.

Although shown as rectangle voltage pulsed in FIG. 4, the voltages 426 used to write to the memristor can include waveform shapes such as rectangle, ramp, or multi-shapes such as dual-rectangle/pulse having a pre-emphasis pop-up and post-emphasis pop-down. Instead of the illustrated voltage waveforms having varying magnitudes but the same pulse width, the voltages 426 can be applied using the same magnitude, but be varied based on increasing or decreasing time (e.g., a greater or fewer number of pulses). Other variations over time for voltages 426 can be used, such as varying multiple pulse widths, or fixed pulse widths having varying magnitudes, ramp voltages, and the like. A particular voltage scheme used can be tailored to address particularities of a given memristor, e.g., based on a mathematical model of the memristor to which the controller may refer.

Thus, the approaches shown in FIG. 4 illustrate a hybrid feedback memristance tuning loop approach, using techniques similar to successive approximation (e.g., when the memristance 427 is outside the memristance tuning window) and flash (e.g., when the memristance 427 is inside the memristance tuning window), to reduce latency and quickly arrive at a target memristance value.

Figure 5:
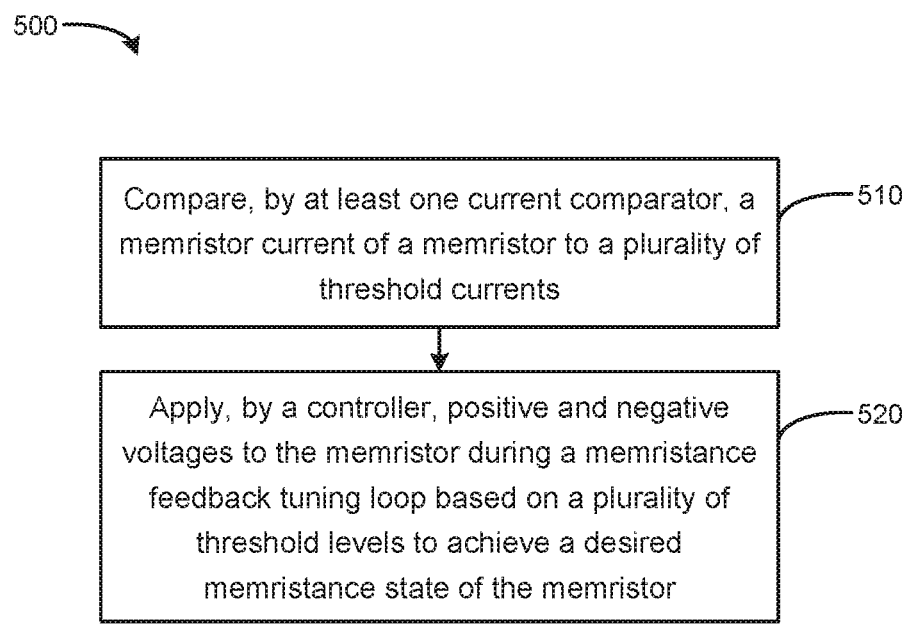
FIG. 5 is a flow chart based on applying voltages during a memristance feedback tuning loop according to an example.
Figure 6:
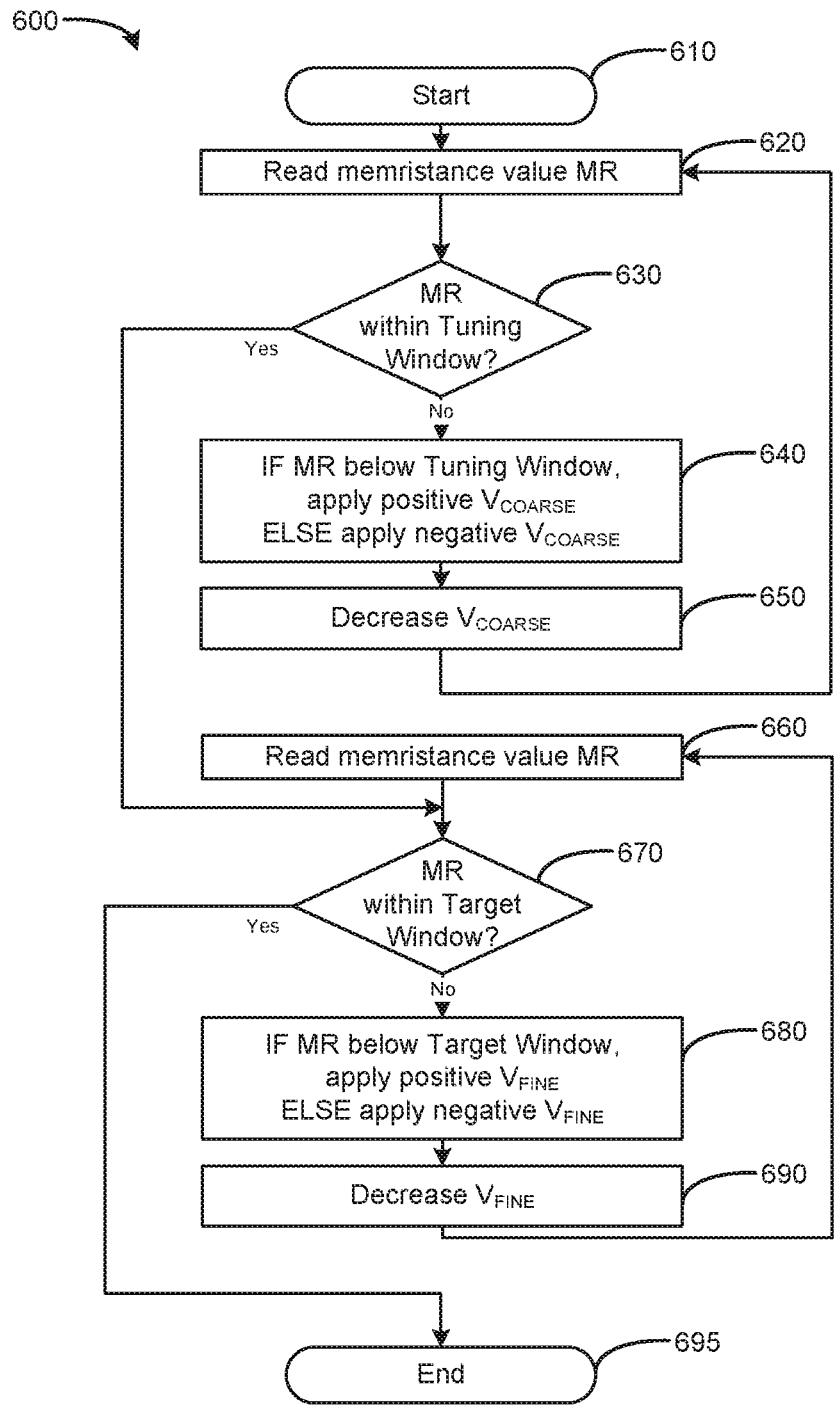
FIG. 6 is a flow chart based on tuning memristance according to an example.

Referring to FIGS. 5 and 6, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 5 is a flow chart 500 based on applying voltages during a memristance feedback tuning loop according to an example. In block 510, at least one current comparator is to compare a memristor current of a memristor to a plurality of threshold currents. For example, a system can perform a plurality of comparisons in series using at least one comparator and a variable threshold current source operated in a comparing loop. In alternate examples, a system can perform a plurality of comparisons in parallel using a plurality of comparators and threshold currents to resolve between which thresholds a memristor current may lie within a memristance tuning window. In block 520, a controller is to apply positive and negative voltages to the memristor during a memristance feedback tuning loop based on a plurality of threshold levels to achieve a desired memristance state of the memristor. For example, the controller can apply relatively larger magnitude voltages to the memristor during iterations of the loop where the memristance falls outside a memristance tuning window, moving the memristance up and down by positive and negative magnitudes that decrease until the memristance falls within the memristance tuning window. When within the memristance tuning window, the controller can apply finer adjustments to the memristance, applying positive and/or negative voltage applications of relatively finer amounts to move the memristance to a target window.

FIG. 6 is a flow chart 600 based on tuning memristance according to an example. Flow starts at block 610. In block 620, a controller is to read the memristance value MR of a selected memristor. For example, the controller can apply a read voltage that is below a write threshold of the memristor. In block 630, the controller is to identify whether the memristance is within a tuning window. For example, whether the memristance falls between a first memristance threshold and an $N^{th}$ resistance threshold (i.e., comparison results include at least one logic 0 and at least one logic 1). If not, flow proceeds to block 640. In block 640, the controller is to apply a positive Vcoarse if the memristance is below the memristance tuning window, or else apply a negative Vcoarse. For example, the controller may identify that the memristance does not result in a logic 1 for any of the comparator comparisons to threshold voltages for the given iteration of the memristance feedback tuning loop. Accordingly, the controller adjusts the memristance by a relatively larger amount (Vcoarse) in an attempt to move the memristance into the memristance tuning window where at least one comparator result would be logic 1 and at least one result would be logic 0. In block, 650, the controller is to decrease the value of Vcoarse. For example, the controller can use a successive approximation approach, decreasing Vcoarse by half. In alternate examples, the controller may decrease Vcoarse by non-linear amounts, such as according to a best fit curve approximation or other amount (e.g., taking into account the memristance value from the previous iteration and the distance to the desired memristance value for the next iteration). Flow then loops back to block 620. If, at block 630, it is determined that the memristance is within the tuning window, flow branches from block 630 to block 660.

In block 660, the controller is to read the memristance value MR. In block 670, the controller is to identify whether the memristance is within a target window. For example, whether the memristance falls between the two middle thresholds, e.g., the thresholds N/2 and (N/2)+1 for an example performing N parallel comparisons with N threshold currents. In block 680, the controller is to apply a positive Vfine if the memristance is below the memristance tuning window, or else apply a negative Vfine. For example, the controller may identify that the memristance results in a logic 1 for some of the comparisons to threshold voltages for the given iteration of the memristance feedback tuning loop, but not corresponding to being in the MR target window. Accordingly, the controller adjusts the memristance by a relatively smaller amount (Vfine) in an attempt to move the memristance into the memristance target window where half of the comparator results would be logic 1 and half would be logic 0. The amount Vfine can be determined based on the number of threshold value steps between the current memristance and the desired target window. The amount Vfine also can be tailored to be more conservative (e.g., to reach the target window indirectly via additional step(s)), to avoid overshooting the target window and to preserve the memristor. In block, 690, the controller is to decrease the value of Vfine. For example, the controller can use similar approaches described above for decreasing Vcoarse. Additionally, the controller can decrease Vfine based on calculating the number of thresholds between the current memristance and the target window, because the memristance now falls withing the memristance tuning window. Flow loops back to block 660. If, at block 670, it is determined that the memristance is within the target window, flow branches from block 670 to block 695. Flow ends at block 695.

Examples provided herein may be implemented in hardware, software, or a combination of both. Example systems can include a processor and memory resources for executing instructions stored in a tangible non-transitory medium (e.g., volatile memory, non-volatile memory, and/or computer readable media). Non-transitory computer-readable medium can be tangible and have computer-readable instructions stored thereon that are executable by a processor to implement examples according to the present disclosure.

An example system (e.g., a computing device) can include and/or receive a tangible non-transitory computer-readable medium storing a set of computer-readable instructions (e.g., software). As used herein, the processor can include one or a plurality of processors such as in a parallel processing system. The memory can include memory addressable by the processor for execution of computer readable instructions. The computer readable medium can include volatile and/or non-volatile memory such as a random access memory ("RAM"), magnetic memory such as a hard disk, floppy disk, and/or tape memory, a solid state drive ("SSD"), flash memory, phase change memory, and so on.

What is claimed is:

1. A system comprising:
   at least one current comparator to compare a memristor current to a plurality of threshold currents; and
   a controller to set a desired memristance state of a memristor according to a memristance feedback tuning loop based on a plurality of threshold levels, whereby the controller is to apply positive and negative voltages to the memristor during the feedback tuning loop to achieve the desired memristance state of the memristor.

2. The system of claim 1, further comprising at least one current summer, wherein the at least one current comparator is to compare the memristor current based on the at least one current summer summing the memristor current and a negative of the threshold current.

3. The system of claim 1, further comprising a current generator to generate a first plurality of threshold currents corresponding to a first desired memristance state, and to generate a second plurality of threshold currents corresponding to a second desired memristance state.

4. The system of claim 1, further comprising a plurality of comparators to compare; in parallel; the memristor current to a plurality of corresponding threshold currents corresponding to the plurality of threshold levels.

5. The system of claim 4, further comprising a current mirror to duplicate the memristor current into a plurality of memristor currents, wherein the plurality of comparators are to compare the duplicated memristor currents to the corresponding plurality of threshold currents in parallel.

6. The system of claim 1, further comprising a variable current generator to generate a plurality of threshold currents in series, wherein the controller is to direct the at least one current comparator to compare the memristor current to the plurality of threshold currents in series via a comparing loop.

7. The system of claim 6, wherein the variable current generator is a current digital-to-analog converter (DAC).

8. The system of claim 1, wherein the controller is to iteratively adjust the positive and negative voltages applied to the memristor during the digital feedback tuning loop based on iterative results of the at least one current comparator.

9. The system of claim 1, wherein the controller is to adjust the positive and negative voltages based on adjusting at least one of a voltage pulse duration, voltage pulse shape, and voltage pulse magnitude.

10. The system of claim 1, wherein the controller is to iteratively adjust the positive and negative voltages applied to the memristor according to a first granularity if a memristance of the memristor is outside a memristance tuning window, and the controller is to adjust according to a second granularity if the memristance is within the memristance tuning window.

11. The system of claim 10, wherein the second granularity corresponds to increments between the plurality of threshold levels.

12. A system comprising:
    a current mirror to duplicate a memristor current of a memristor to a plurality of memristor currents;
    a plurality of current comparators to compare, in parallel, the corresponding plurality of memristor currents to a corresponding plurality of threshold currents; and
    a controller to set a desired memristance state of the memristor according to a memristance feedback tuning loop based on a plurality of threshold levels corresponding to comparisons of the plurality of threshold currents, wherein the controller is to apply positive and negative voltages to the memristor during the feedback tuning loop to achieve the desired memristance state of the memristor.

13. The system of claim 12, further comprising a plurality of current summers to sum a given memristor current and a negative of a given corresponding threshold current for the plurality of threshold currents, wherein a comparator of the plurality of comparators is to indicate a logic 1 if its sum is not negative, and a logic 0 if its sum is negative, for the plurality of comparators.

14. A method, comprising:
    comparing, by at least one current comparator, a memristor current of a memristor to a plurality of threshold currents; and
    applying, by a controller, positive and negative voltages to the memristor during a memristance feedback tuning loop based on a plurality of threshold levels to achieve a desired memristance state of the memristor.

15. The method of claim 14, further comprising iteratively adjusting the positive and negative voltages applied to the memristor according to a first granularity if a memristance of the memristor is outside a memristance tuning window, and adjusting the positive and negative voltages according to a second granularity if the memristance is within the memristance tuning window.

* * * * *